United States Patent
Sota et al.

(10) Patent No.: US 6,236,108 B1
(45) Date of Patent: *May 22, 2001

(54) SUBSTRATE FOR HOLDING A CHIP OF SEMI-CONDUCTOR PACKAGE, SEMI-CONDUCTOR PACKAGE, AND FABRICATION PROCESS OF SEMI-CONDUCTOR PACKAGE

(75) Inventors: Yoshiki Sota, Nara; Koji Miyata, Yao; Toshio Yamazaki, Tsukuba; Fumio Inoue, Tsukuba; Hidehiro Nakamura, Tsukuba; Yoshiaki Tsubomatsu, Tsuchiura; Yasuhiko Awano, Tsukuba; Shigeki Ichimura, Oyama; Masami Yusa; Yorio Iwasaki, both of Shimodate, all of (JP)

(73) Assignees: Hitachi Chemical Company, Ltd.; Sharp Corporation, both of (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/541,041

(22) Filed: Mar. 31, 2000

Related U.S. Application Data

(63) Continuation of application No. 08/903,996, filed on Jul. 31, 1997, now Pat. No. 6,064,111.

(30) Foreign Application Priority Data

Jul. 31, 1996 (JP) .................................. 8-201906
Jul. 31, 1996 (JP) .................................. 8-201908

(51) Int. Cl.$^7$ ..................... H01L 23/495; H01L 21/44
(52) U.S. Cl. ..................... 257/667; 257/693; 438/123; 438/124
(58) Field of Search ..................... 257/667, 668, 257/693; 438/123, 124, 125, 126, 127, 612, 613

(56) References Cited

U.S. PATENT DOCUMENTS 6,064,111 * 5/2000 Sota et al. ..................... 257/667

* cited by examiner

Primary Examiner—Kevin M. Picardat
(74) Attorney, Agent, or Firm—Pennie & Edmonds LLP

(57) ABSTRACT

A semiconductor packaging chip-supporting substrate of the present invention comprises an insulating supporting substrate, wiring provided on the substrate, and an insulating film provided on the wiring. The wiring each have i) an inner connection that connects to a semiconductor chip electrode and ii) a semiconductor chip-mounting region. An opening is also provided in the insulating supporting substrate at its part where each of the wiring is formed on the insulating supporting substrate, which is the part where an outer connection conducting to the inner connection is provided. The insulating film is formed at the part on which the semiconductor chip is mounted, covering the semiconductor chip-mounting region of the wiring.

14 Claims, 3 Drawing Sheets

SUBSTRATE FOR HOLDING A CHIP OF SEMI-CONDUCTOR PACKAGE, SEMI-CONDUCTOR PACKAGE, AND FABRICATION PROCESS OF SEMI-CONDUCTOR PACKAGE

This is a continuation of application No. 08/903,996, filed Jul. 31, 1997, now U.S. Pat. No. 6,064,111.

BACKGROUND OF THE INVENTION

1. Field of the Invention

This invention relates to a chip-supporting substrate for semiconductor packaging, a semiconductor package, and a process for fabricating the semiconductor package.

2. Description of the Related Art

The number of input/output terminals has increased with improvements in the integration of semiconductors. Accordingly, it has become necessary to provide a semiconductor package having a large number of input/output terminals. In general, the input/output terminals are grouped into a type in which they are arranged around a package in a row and a type in which they are arranged in multiple rows not only around but also inside the package. The former is typified by QFP (quad flat package). When this is made to have a larger number of terminals, terminal pitches must be made smaller, where, in a region of 0.5 mm pitch or less, a high-level technique is required to connect them to the wiring board. The latter array type enables the terminals to be arranged at a relatively large pitch, and hence this is suited for providing multiple pins. Conventionally, PGA (pin grid array) having connecting pins is commonly used as the array type, but this is not suitable for surface packaging because the terminals are connected to the wiring board by insertion. Thus, a package called BGA (ball grid array) has been developed, which enables the surface mounting.

Meanwhile, with the miniaturization of electronic equipment, there is an increasing demand for making the package size much smaller. As a measure to cope with such a demand for smaller size, what is called the chip size package (CSP) has been proposed, which has substantially the same size as a semiconductor chip. This is a package having the connections to an external wiring substrate not around the semiconductor chip but in the mounting region. As examples thereof, it includes a package prepared by bonding a polyimide film having bumps to the surface of a semiconductor chip and providing electrical connections to the chip through gold lead wires, followed by potting with epoxy resin or the like to effect sealing (NIKKEI MATERIALS & TECHNOLOGY 94.4, No. 140, pp.18–19), and a package prepared by forming metal bumps on a provisional substrate at its positions corresponding to the connections to a semiconductor chip and an external wiring substrate and attaching the semiconductor chip by face-down bonding, followed by transfer molding on the provisional substrate ("Smallest Flip-chip-like Package CSP", The Second VLSI Packaging Workshop of Japan, pp.46–50, 1994).

However, most semiconductor packages hitherto proposed are by no means those which can be adapted to the smaller size and higher integration, can be prevented from package cracking, have a good reliability and also have a good productivity.

SUMMARY OF THE INVENTION

The present invention provides a semiconductor packaging-chip-supporting substrate, a semiconductor package, and a process for fabricating the semiconductor package, which make it possible to produce a small-sized semiconductor package less susceptible to package cracking and having a good reliability.

A first semiconductor packaging chip-supporting substrate of the present invention comprises;

A. an insulating supporting substrate on one surface of which a plurality of wiring are formed; the wiring each having at least i) an inner connection that connects to a semiconductor chip electrode and ii) a semiconductor chip-mounting region;

B. an opening provided in the insulating supporting substrate at its part where each of the wiring is formed on the insulating supporting substrate, which is the part where an outer connection conducting to the inner connection is provided;

C. at least one first through-hole provided between the wiring within the semiconductor chip-mounting region of the insulating supporting substrate;

D. an insulating film formed at the part on which the semiconductor chip is mounted, covering the semiconductor chip-mounting region of the wiring;

E. the insulating film being so provided as to form a hollow between the film and the insulating supporting substrate around the through-hole.

A second semiconductor packaging chip-supporting substrate of the present invention comprises;

A. an insulating supporting substrate on one surface of which a plurality of wiring are formed; the wiring each having at least i) an inner connection that connects to a semiconductor chip electrode and ii) a semiconductor chip-mounting region;

B. an opening provided in the insulating supporting substrate at its part where each of the wiring is formed on the insulating supporting substrate, which is the part where an outer connection conducting to the inner connection is provided;

C. an insulating film formed at the part on which the semiconductor chip is mounted, covering the semiconductor chip-mounting region of the wiring; and D. at least one metal pattern for maintaining the flatness of the insulating film, formed on the insulating supporting substrate at its part where the insulating film is formed.

The semiconductor package of the present invention comprises the semiconductor packaging chip-supporting substrate of the present invention as described above, a semiconductor chip mounted on the surface of the insulating film of the insulating supporting substrate, and a resin seal that encapsulates the semiconductor chip.

The process for fabricating a semiconductor package comprises the steps of bonding a semiconductor chip to the surface of an insulating film of the semiconductor packaging chip-supporting substrate of the present invention as described above, connecting a semiconductor chip electrode to an inner connection of a wiring by wire bonding, encapsulating the semiconductor chip with resin, and providing, at an opening of the supporting substrate, an outer connection conducting to the inner connection.

As the insulating film, an insulating filmy adhesive may preferably be used.

The opening provided in the insulating supporting substrate may preferably be provided in the insulating supporting substrate at a part where the wiring in the semiconductor chip-mounting region is formed. The opening thus provided in the insulating supporting substrate at the part where the semiconductor chip-mounting region is formed makes it easy to fabricate a small-sized semiconductor package.

The insulating supporting substrate may also be provided with a seal region to be covered with a sealing resin for encapsulating the semiconductor chip, and at least one second through-hole may be provided in the seal region.

In the second semiconductor packaging chip-supporting substrate according to the present invention, at least one first through-hole may be provided between the wiring within the semiconductor chip-mounting region of the insulating supporting substrate, and the insulating film may be so provided as to form a hollow between the film and the insulating supporting substrate around the first through-hole. It is preferable for a plurality of metal pattern to be formed, and for the distance between thereof to be 1 millimeter or less. More specifically, it is preferred that at least one metal pattern is formed within the range of a 1 millimeter radius from an arbitrary point. Such a plurality of metal patterns may preferably be arranged uniformly.

DESCRIPTION OF THE PREFERRED EMBODIMENTS

Figure 1A:
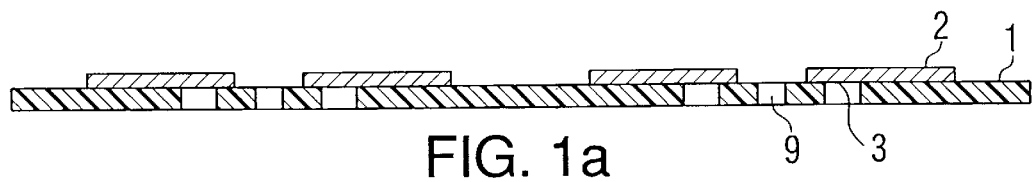
FIG. 1 is a cross-sectional view showing the process of fabricating a semiconductor package in Example 1.
Figure 1B:
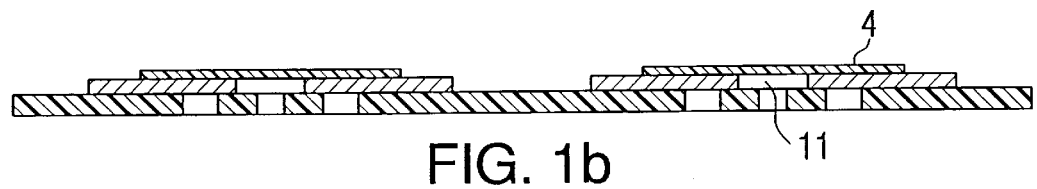
Figure 1C:
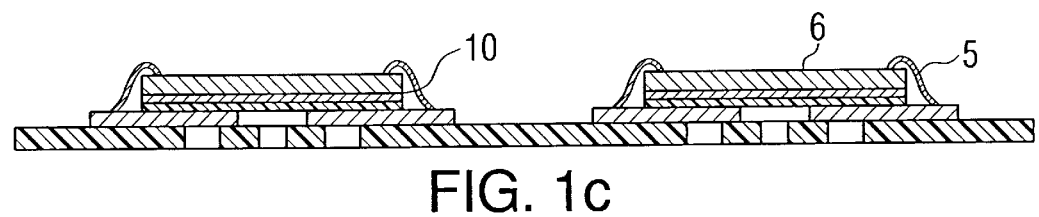
Figure 1D:
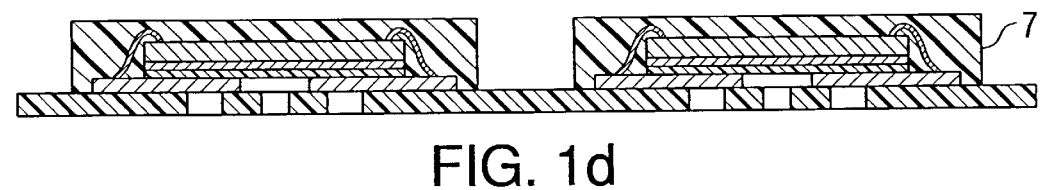
Figure 1E:
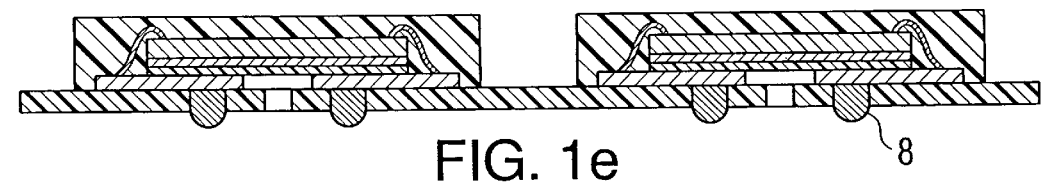
Figure 1F:
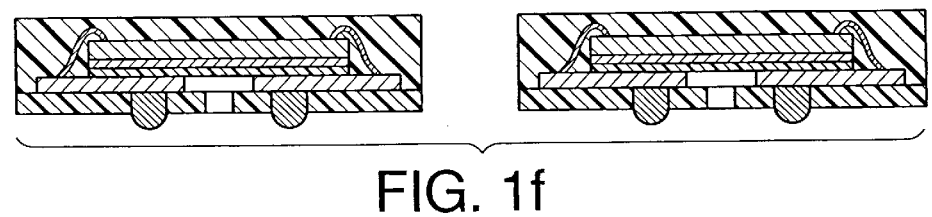
Figure 2A:
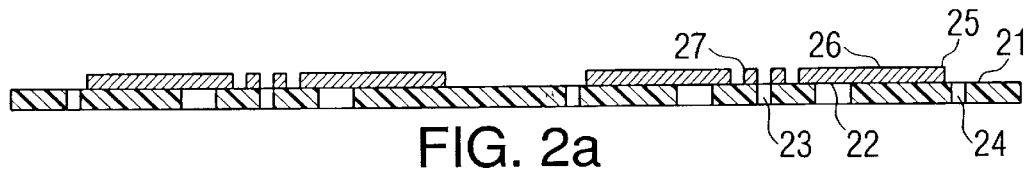
FIG. 2 is a cross-sectional view showing the process of fabricating a semiconductor package in Example 2.
Figure 2B:
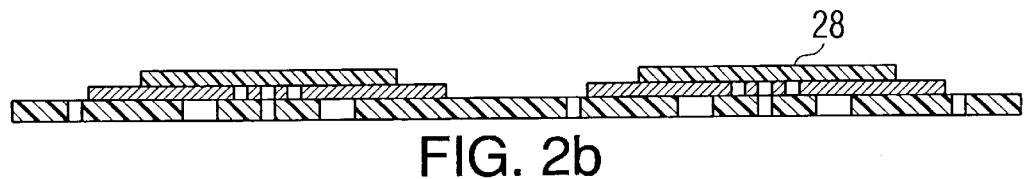
Figure 2C:
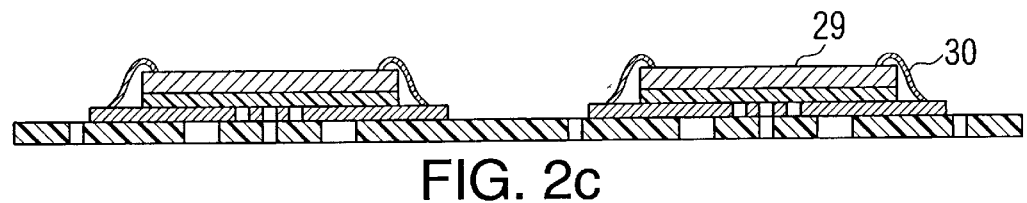
Figure 2D:
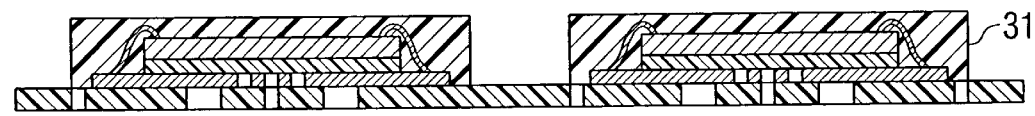
Figure 2E:
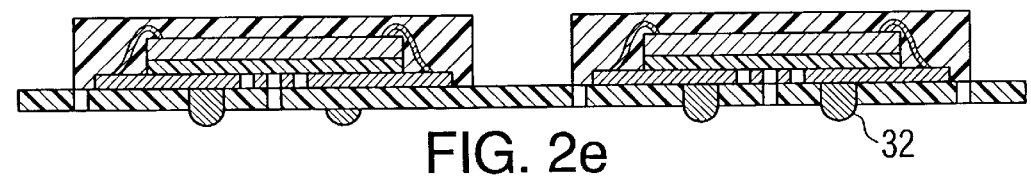
Figure 2F:
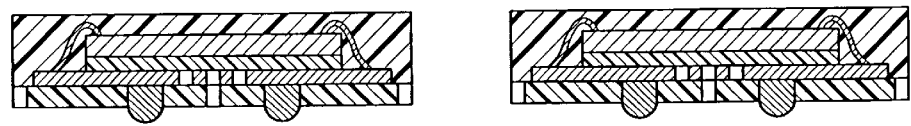

As the insulating supporting substrate, a plastic film formed of polyimide, epoxy resin or polyimide, or a substrate comprised of a base material such as a glass nonwoven fabric impregnated with plastic of polyimide, epoxy resin or polyimide or the like may be used.

To form a plurality of wiring on one surface of the insulating supporting substrate, they may be formed by, e.g., a method in which copper foil is etched, a method in which copper plating is applied at stated portions, or a method in which these are used in combination.

To provide openings such as external connections and through-holes in the insulating supporting substrate, it may be carried out by mechanical processing such as drilling or punching, or laser processing using an excimer laser or a carbon dioxide gas laser. It is also possible to use, e.g., a method in which the openings are previously provided in an adhesive insulating base material and the resultant base material is laminated with metal foil for wiring formation such as copper foil, a method in which the openings are provided in an insulating base material provided with copper foil or on which wiring has been formed, or a method where these are used in combination. Outer connections conducting to inner connections may be provided by forming bumps or the like at the openings of the insulating supporting substrate by solder-ball bonding, plating or the like. These are connected to an external substrate.

In each semiconductor chip-mounting region, a wiring pattern may preferably be disposed as uniformly as possible. Stated specifically, on the insulating supporting substrate at its semiconductor chip-mounting region, the wiring pattern may preferably be so disposed that at least one wiring is formed within the range of a 1 millimeter radius from an arbitrary point, inclusive of the arbitrary point. However, when such a condition can not be fulfilled by the wiring pattern alone, an independent dummy pattern, registration marks, letters and symbols, or the like may be additionally provided. This makes it hard for the insulating film to adhere to the insulating supporting substrate around the first through-hole when the insulating film is bonded.

In the present invention, the metal pattern is meant to be any preset pattern including an outer connection, spread wiring that connects an inner connection and an outer connection, wiring that connects between the spread wiring, a dummy pattern independent therefrom, registration marks, and letters and symbols.

The metal pattern may be optionally provided, and may preferably be disposed as uniformly as possible especially in the bonding film-mounting region. Stated specifically, on the insulating supporting substrate in the region where the insulating filmy adhesive is formed, the metal pattern may preferably be so disposed that at least one metal pattern region is formed within the range of a 1 millimeter radius from an arbitrary point, inclusive of the arbitrary point.

As the insulating film, a plastic film formed of polyimide, epoxy resin or polyimide on one side or both sides of which an adhesive has been coated or an insulating filmy adhesive may be used.

The insulating filmy adhesive may include a filmy adhesive comprised of a polyimide resin obtained by allowing a tetracarboxylic dianhydride containing a tetracarboxylic dianhydride (1) represented by the formula (1):

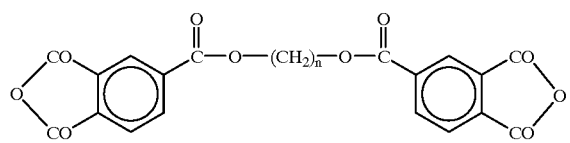

(1)

(wherein n indicates an integral number of 2–20). in an amount of 70 mol % or more of the total tetracarboxylic dianhydride, to react with a diamine, and also a filmy adhesive comprised of a thermosetting resin such as epoxy resin. This may be further incorporated with an inorganic material filler such as silica or alumina.

In the case when the insulating filmy adhesive is used, its thickness may preferably be as small as possible so long as the insulation between the semiconductor chip and the wiring can be ensured. The smaller it is, the less the adhesive is likely to sag to make it harder to become adhere around the first through- holes of the insulating supporting substrate. Before adhesion, the filmy adhesive may preferably have a thickness of, stated specifically, not less than 0.005 mm and not more than 0.030 mm, and more preferably not less than 0.01 mm and not more than 0.020 mm as a thickness for exhibiting stable reflow resistance and insulation properties to all sorts of substrates, wiring patterns and so forth.

The first through-hole is formed in the insulating film-mounting region. There are no particular limitations on its diameter, and preferably it may have a diameter of not less than 0.05 mm and not more than 1.0 mm. There are also no particular limitations on its disposition, and preferably a plurality of through-holes may be disposed and as uniformly as possible. This hole size and disposition may be selected in accordance with the wiring pattern.

As the second through-hole, at least one through-hole is formed at the part coming into contact with the sealing resin used in a later step (which is the part effective for the package and does not include liners for injecting the resin). There are no particular limitations on its diameter, and preferably it may have a diameter selected within the range of not less than 0.001 and not more than 1.0 mm. There are also no particular limitations on its disposition, but it is effective for the second through-holes to be formed at corners and outskirts or the like. The second through-hole may be in the shape of a rectangle, an integrated L-form or a circle. A method is also available in which a plurality of holes are disposed in L-form at the corners of a sealing material so that the package can be effective as a whole.

To fabricate the semiconductor package by the use of the semiconductor packaging chip-supporting substrate of the present invention, first the semiconductor chip is mounted on the surface of the insulating film of the semiconductor packaging chip-supporting substrate of the present invention. Here, when the insulating film has the function as an adhesive, the semiconductor chip may be mounted as it is, or may be done using a paste die-bonding adhesive in combination. Next, the semiconductor chip electrode is connected to the inner connection of the supporting substrate by wire bonding or the like. Then, the semiconductor chip is resin-encapsulated at least the face of the semiconductor chip having electrode, and bumps are formed as outer connections at the openings by solder-ball bonding, plating or the like, and thus the semiconductor package can be produced.

The present invention has advantages as stated below.

In a semiconductor package fabricated by;

a. forming plural sets of wiring (each having at least i) an inner connection that connects to a semiconductor chip electrode and ii) a semiconductor chip-mounting region) on one surface of an insulating supporting substrate;
b. providing an opening in the insulating supporting substrate at a part where each of the wiring regions is formed on the insulating supporting substrate, which is the part where an outer connection conducting to the inner connection is provided;
c. providing at least one first through-hole in the insulating supporting substrate at a semiconductor chip- mounting region having no wiring;
d. forming an insulating film at the part on which the semiconductor chip is mounted, covering the semiconductor chip-mounting region of the wiring;
e. bonding a semiconductor chip to the supporting substrate on a side where the inner connection is provided;
f. connecting a semiconductor chip electrode to the inner connection of the substrate by wire bonding; and
g. encapsulating the semiconductor chip with a resin at least on a semiconductor chip electrode side;
   the insulating film is hitherto applied by filling up valleys of wiring irregularities with an adhesive or a filmy adhesive before it is bonded to the insulating supporting substrate. Hence, it follows that the first through-holes (vent holes) for improving reliability are filled up with adhesive. It has thus been impossible to make good use of the ventilation function of through-holes. Hence, when mounted to the external substrate by IR reflowing or the like, peeling or package cracking tends to occur to cause a lowering of reliability.

In addition, in the above semiconductor package, some wiring are laid bare to the semiconductor chip-mounting region of the supporting substrate. Hence, when usual paste adhesive materials (silver paste or paste adhesive) are used, there is a possibility of causing a short between the semiconductor chip and the wiring. Accordingly, the structure must be employed wherein an insulating material such as a resist is coated on the semiconductor chip-mounting region or an insulating film is applied thereon. Such a structure, however, produces many material interfaces, and also the adhesive material paste tends to cause inclusion of voids when the semiconductor chip is bonded, so it tend to cause peeling or package cracking in a hygroscopic reflow test, resulting in a lowering of reliability.

In the present invention, the insulating film is applied on the wiring to stretch like a tent, whereby a hollow state at the vent hole can be maintained, thus the function of the vent hole can be well exhibited and any gas or vapor generated from the die-bonding material at the time of reflowing can be reliably released out of the package. Hence, it becomes possible to produce a small-sized semiconductor in which package cracking is prevented and having high reliability.

In the present invention, at least one region of a metal pattern for maintaining the flatness of the insulating film is formed at the part where the insulating film is formed, and hence the insulating bonding film can be prevented from caving in at a part where the wiring regions are sparse. Thus, the flatness of the insulating film can be maintained, any gap can be prevented from being produced between the chip and the insulating film, and therefore the adhesion between the bonding film and the chip can be improved. This brings about an improvement in reflow resistance and long-term reliability.

In addition, the insulating film formed in a thickness as small as 0.030 mm or less makes it possible to reduce the volume of a substance causing moisture absorption inside the package to the utmost and to improve the reflow resistance. From the viewpoint of ensuring insulation resistance, however, it has been necessary for the insulating film to have a thickness of at least 0.005 mm. Thus, a package having a high reliability can be obtained when the insulating film is formed in a thickness of not less than 0.005 mm and not more than 0.030 mm. Exact control of such a layer thickness can be achieved with ease when the filmy adhesive is used.

Moreover, the through-hole (a) (the first through-hole) provided in the insulating supporting substrate at a part where the insulating film is formed prevents air from being held in between the insulating film and the insulating substrate when the insulating film is bonded to the insulating substrate. If the chip is mounted and encapsulated in the state the air is held in, peeling or cracking may occur in the step of reflowing mentioned above, to cause a lowering of reliability. In the reflowing step, this through-hole can also properly release therefrom the water content absorbed by the insulating film and so forth before that step, and can prevent the peeling or cracking from occurring inside the package.

Furthermore, at least one through-hole (b) (the second through-hole) is provided in the insulating supporting substrate at a part coming into contact with the sealing resin. This is effective for improving adhesion between the supporting substrate and the sealing material because part of the sealing resin flows through it in the step of encapsulating. This can bring about an improvement in reflow resistance, long-term reliability, and handling properties after encapsulating.

Thus, the present invention makes it possible to produce a small-sized semiconductor package in which package cracking is prevented, and having a high reliability.

EXAMPLE 1

A working example of the present invention will be described below with reference to FIG. 1.

On a polyimide bonding sheet 1 of 0.07 mm thickness, comprised of a polyimide film coated on its both sides with a polyimide adhesive, openings 3 serving as outer connections and through-holes (vent holes) 9 are formed by drilling. Next, copper foil of 0.018 mm thickness (available from Nippon Denkai K.K.; trade name: SLP-18) is bonded thereto, and thereafter inner connections and spread wiring 2 are formed by conventional etching. To the wiring standing bare to the surface, electroless nickel plating (layer thickness: 5 mm) and electroless gold plating (layer thickness: 0.8 mm) are successively applied (not shown). Here, electroless plating is used. Alternatively, electrolytic plating may be used.

Next, using a punching mold, the sheet thus processed is punched into a frame to prepare a supporting substrate in which plural sets of inner connections, spread wiring and outer connections have been formed (FIG. 1, step a). The supporting substrate may also be prepared by a method in which the polyimide of a commercially available double-layer (copper/polyimide) flexible substrate is subjected to laser processing to form the outer connection, holes and so forth.

Next, to the semiconductor chip-mounting regions of the supporting substrate, die-bond films 4 (available from Hitachi Chemical Co., Ltd.; trade name: DF-335; thickness: 0.015 mm) are bonded (FIG. 1, step b). The films are bonded under conditions of, e.g., a temperature of 160° C., a time of 5 seconds and a pressure of 3 kgf/cm2. Under such conditions, the die-bond films 4 can be kept in the state of flat-sheet films and also any adhesive materials may not sag. Hence, the die-bond films 4 can be bonded only in the vicinity of the top surface of metal pattern parts such as the wiring or the like and do not adhere to the bonding sheet 1, thus hollow regions (hollows) 11 are each formed between the die-bond film 4 and the bonding sheet 1.

Next, onto the die-bond films 4 thus bonded, semiconductor chips 6 are bonded at the preset positions of the supporting substrate, using a paste adhesive (available from Hitachi Chemical Co., Ltd.; trade name: EN-4322) 10, followed by post-curing at 180° C. for 1 hour to cause the die-bond films and the paste adhesive to cure. Semiconductor chip electrodes and inner connections are further electrically connected by bonding with gold wires 5 (FIG. 1, step c). The substrate with components thus formed is set in a transfer mold, and each semiconductor chip is encapsulated with a semiconductor sealing epoxy resin 7 (available from Hitachi Chemical Co., Ltd.; trade name: CL-7700) (FIG. 1, step d). Thereafter, solder balls 8 are provided at the openings serving as the outer connections, followed by melting (FIG. 1, step e), and then punching to separate the whole into individual packages to obtain semiconductor packages (FIG. 1, step f).

EXAMPLE 2

Another working example of the present invention will be described below with reference to FIGS. 2 and 3.

On a polyimide bonding sheet 21 of 0.07 mm thick, comprised of a polyimide film coated on both sides with a polyimide adhesive, outer connections 22, through-holes (a) 23 and through-holes (b) 24 are formed. The through-holes (a) 23 (the first through-holes) and through-holes (b) 24 (the second through-holes) are respectively formed at the part where an insulating adhesive material is formed in a later step and at the part coming into contact with a sealing material.

Next, copper foil of 0.018 mm thickness (available from Nippon Denkai K.K.; trade name: SLP-18) is bonded thereto, and thereafter spread wiring 26 each spreading from the inner connections 25 to the outer connection 22, and dummy patterns 27 (these regions 22, 25 and 26 are collectively called "metal pattern") are formed by conventional etching. To the wiring standing bare to the surface, electroless nickel plating (layer thickness: 5 µm) and electroless gold plating (layer thickness: 0.8 m) are successively applied (not shown). Here, electroless plating is used. Alternatively, electrolytic plating may be used.

Next, using a punching mold, the sheet thus processed is punched into a frame to prepare a supporting substrate in which plural sets of inner connections, spread wiring regions and outer connections have been formed (FIG. 2, step a). The supporting substrate may also be prepared by a method in which the polyimide of a commercially available double-layer (copper/polyimide) flexible substrate is subjected to laser processing to form the outer connection, holes and so forth.

Next, to the semiconductor chip-mounting regions of the supporting substrate, die-bond films 28 (available from Hitachi Chemical Co., Ltd.; trade name: DF-335; thickness: 0.015 mm) are provisionally bonded (FIG. 2, step b). The films are provisionally bonded under conditions of, e.g., a temperature of 160° C., a time of 5 seconds and a pressure of 3 kgf/cm2, which depends on the composition of adhesives.

Figure 3:
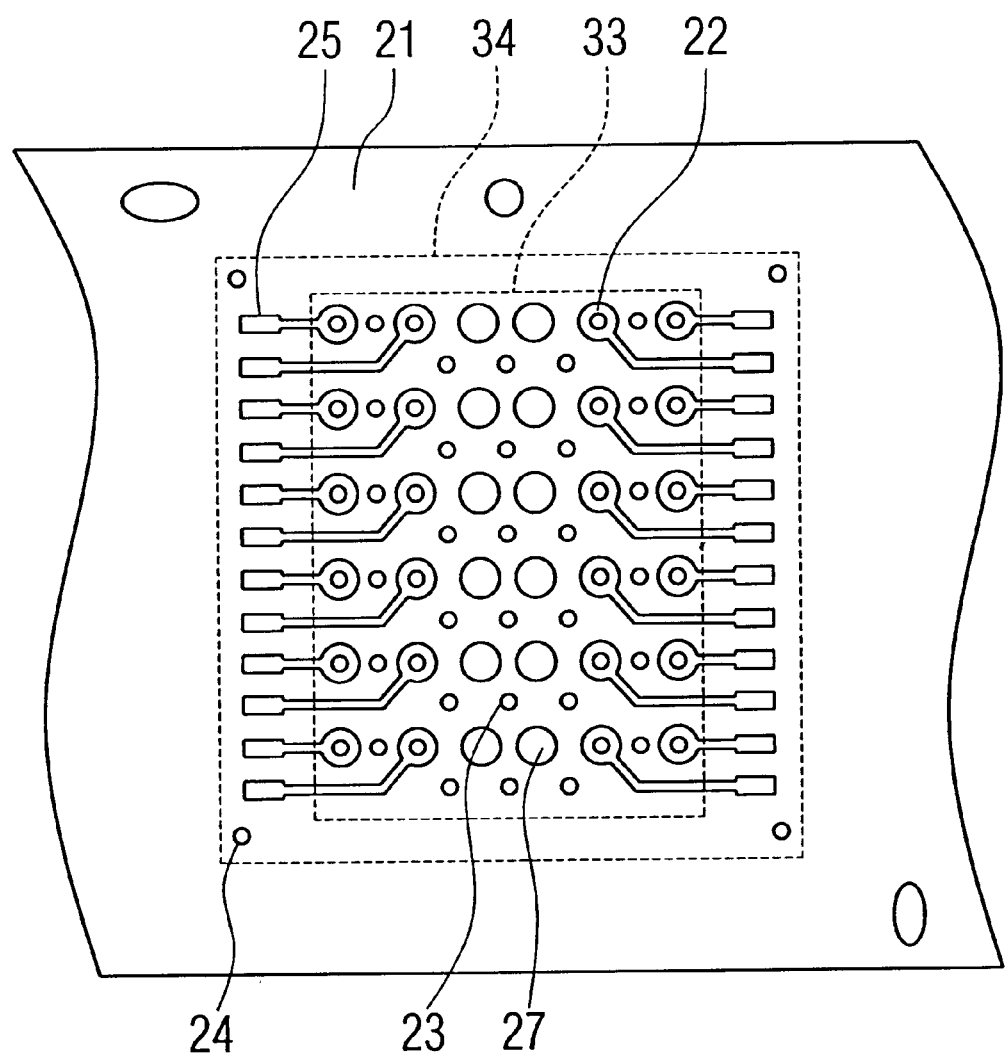
FIG. 3 is a plan view of a semiconductor packaging chip-supporting substrate of Example 2.

FIG. 3 shows an example of plane disposition of the semiconductor packaging chip-supporting substrate prepared by the process up to this step. Without limitation to an instance in which inner terminals are provided at both ends of the chip as in this example, they may be provided at four sides. In FIG. 3, reference numeral 33 denotes the semiconductor chip-mounting region, and 34, an encapsulating region.

Next, using the die-bond films provisionally bonded in the previous step, semiconductor chips 29 are bonded at the preset positions of the supporting substrate, which are bonded under conditions of, e.g., a temperature of 220° C., a time of 5 seconds and a pressure of 300 gf/cm2. Semiconductor chip electrodes and inner connections 25 are further electrically connected by bonding gold wires 30 (FIG. 2, step c). The substrate with components thus formed is set in a transfer mold, and each semiconductor chip is encapsulated with a semiconductor sealing epoxy resin 31 (available from Hitachi Chemical Co., Ltd.; trade name: CL-7700) (FIG. 2, step d). Thereafter, solder balls 32 are provided at the openings serving as the outer connections, followed by melting (FIG. 2, step e), and then finally punching to separate the whole into individual packages (FIG. 2, step f).

In the present example, the die-bond films of 0.015 mm thick were used. For comparison, samples having different die-bond film thicknesses were prepared to make a hygroscopic reflow test (test conditions: after leaving for 96 hours at temperature: 30° C., humidity: 75%, and then, two cycles of IR reflow, at temperature: 230° C.). As the result, it was found that good reflow resistance (free of peeling, blistering and internal cracking due to reflow) was seen when the die bond film was in a thickness of 0.030 mm or less. Samples similarly having different die-bond film thicknesses were left to stand in a thermo-hygrostat (under conditions of temperature: 85° C., humidity: 85%), and their insulation resistance between wiring (line/space: 0.040/0.040 mm) was examined to reveal that they caused an abrupt decrease in insulation resistance after 1,000 hours when the die-bond film was in a thickness of less than 0.005 mm. This insulation resistance was $10^{12}$ Ω at the initial stage and became $10^2$ Ω or below after testing, but caused no decrease in insulation resistance when the die-bond film was in a thickness of not less than 0.005 mm, being $10^{12}$ Ω or above at the initial stage and $10^2$ Ω or above after testing. Thus, it is preferable for the die-bond film to be in a thickness of not less than 0.005 mm and not more than 0.030 mm.

For another comparison, samples provided with no dummy pattern 27 were prepared to make the above hygroscopic reflow test together with the sample prepared in Example 2. As a result, the samples provided with no dummy pattern did not satisfy the reflow resistance.

For still another comparison, samples having neither through-holes (a) 23 nor through-holes (b) 24 were prepared to make the above hygroscopic reflow test together with the sample prepared in Example 2. As a result, neither of the samples without through-holes satisfied the reflow resistance.

In FIGS. 1 to 3, reference numeral 1 denotes the polyimide bonding sheet; 2, the inner connection and spread wiring; 3, the opening; 4, the die-bond film; 5, the gold wire; 6, the semiconductor chip; 7, the semiconductor sealing epoxy resin; 8, the solder ball; 9, the through-hole; 10, the paste adhesive; 11, the hollow region (hollow); 21, the polyimide bonding sheet; 22, the outer connection; 23, the through-hole (a); 24, the through-hole (b); 25, the inner connection; 26, the spread wiring; 27, the dummy pattern; 28, the die-bond film; 29, the semiconductor chip; 30, the gold wire; 31, the semiconductor sealing epoxy resin; 32, the solder ball; 33, the bonding film-mounting region; and 34, the sealing region.

What is claimed is:

1. A semiconductor packaging chip-supporting substrate comprising:
   (a) an insulating supporting substrate on one surface of which a plurality of wirings are formed; said wirings each having at least:
      (i) an inner connection that connects to a semiconductor chip electrode, and
      (ii) a semiconductor chip-mounting region;
   (b) an opening provided in said insulating supporting substrate at a part where each of said wirings is formed on said insulating supporting substrate, which is a part where an outer connection is provided conducting to said inner connection; and
   (c) at least one through-hole provided between said wirings within said semiconductor chip-mounting region of said insulating supporting substrate; wherein
   (d) said through-hole is provided in such a manner that an insulating film formed at a position on which the semiconductor chip will be mounted later, covering said semiconductor chip-mounting region of said wiring region, forms a hollow between said insulating film and said insulating supporting substrate around said through-hole.

2. The semiconductor packaging ship-supporting substrate according to claim 1, wherein said opening is provided in said insulating supporting substrate at its part where said wirings are formed in said semiconductor chip- mounting region.

3. A semiconductor packaging chip-supporting substrate comprising:
   (a) an insulating supporting substrate on one surface of which a plurality of wirings are formed; said wirings each having at least:
      (i) an inner connection that connects to a semiconductor chip electrode, and
      (ii) a semiconductor chip-mounting region;
   (b) an opening provided in said insulating supporting substrate at a part where each of said wiring is formed on said insulating supporting substrate, which is a part where an outer connection is provided conducting to said inner connection; and
   (c) at least one metal pattern for maintaining the flatness of an insulating filmy adhesive, which will be provided later, at a position where a semiconductor chip is to be mounted covering said semiconductor chip mounting region of said wiring region.

4. The semiconductor packaging chip-supporting substrate according to claim 3, wherein at least one first through-hole is provided at the position where said insulating filmy adhesive of said insulating supporting substrate is placed.

5. The semiconductor packaging chip-supporting substrate according to claim 3, wherein said insulating supporting substrate is provided with a seal region to be covered with a sealing resin for encapsulating the semiconductor chip, and at least one second through-hole is provided in said seal region.

6. The semiconductor packaging chip-supporting substrate according to claim 4, wherein said insulating supporting substrate is provided with a seal region to be covered with a sealing resin for encapsulating the semiconductor chip, and at least one second through-hole is provided in said seal region.

7. The semiconductor packaging chip-supporting substrate according to claim 3, wherein a plurality of said metal patterns are formed at a distance of 1 millimeter or less from respective adjacent pattern.

8. The semiconductor packaging chip-supporting substrate according to claim 4, wherein a plurality of said metal patterns are formed at a distance between adjacent regions thereof, of 1 millimeter or less.

9. The semiconductor packaging chip-supporting substrate according to claim 5, wherein a plurality of said metal patterns are formed at a distance between adjacent regions thereof, of 1 millimeter or less.

10. The semiconductor packaging chip-supporting substrate according to claim 6, wherein a plurality of said metal patterns are formed at a distance between adjacent regions thereof, of 1 millimeter or less.

11. The semiconductor packaging chip-supporting substrate according to claim 7, wherein the plurality of metal patterns are arranged uniformly.

12. The semiconductor packaging chip-supporting substrate according to claim 8, wherein the plurality of metal patterns are arranged uniformly.

13. The semiconductor packaging chip-supporting substrate according to claim 9, wherein the plurality of metal patterns are arranged uniformly.

14. The semiconductor packaging chip-supporting substrate according to claim 10, wherein the plurality of metal patterns are arranged uniformly.

* * * * *